United States Patent
Quinlan et al.

(10) Patent No.: US 7,414,299 B2
(45) Date of Patent: *Aug. 19, 2008

(54) SEMICONDUCTOR PACKAGE ASSEMBLY AND METHOD FOR ELECTRICALLY ISOLATING MODULES

(75) Inventors: Sion C. Quinlan, Oxon (GB); Tim J. Bales, Bracknell (GB)

(73) Assignee: Micron Technology, Inc., Boise, ID (US)

(*) Notice: Subject to any disclaimer, the term of this patent is extended or adjusted under 35 U.S.C. 154(b) by 573 days.

This patent is subject to a terminal disclaimer.

(21) Appl. No.: 11/041,106

(22) Filed: Jan. 20, 2005

(65) Prior Publication Data

US 2005/0121754 A1  Jun. 9, 2005

Related U.S. Application Data

(62) Division of application No. 10/675,965, filed on Sep. 30, 2003, now Pat. No. 7,221,040, which is a division of application No. 10/057,205, filed on Jan. 25, 2002, now Pat. No. 6,851,183.

(30) Foreign Application Priority Data

Nov. 7, 2001 (GB) .................. 0126821.8

(51) Int. Cl.
*H01L 29/40* (2006.01)
(52) U.S. Cl. ............ 257/664; 257/684; 257/734; 257/735; 257/724; 257/725; 257/E25.016; 257/E21.522; 257/E21.495; 257/E21.415; 361/782; 361/734; 438/400; 438/110; 438/107
(58) Field of Classification Search .......... 257/666, 257/684, 664, 734, 735, 724, 725, E25.016, 257/E21.522, E21.495, E21.415; 361/734, 361/735, 782; 438/400, 110, 107
See application file for complete search history.

(56) References Cited

U.S. PATENT DOCUMENTS

| 5,006,962 A | 4/1991 | Haley ............... 361/417 |
| 5,027,253 A | 6/1991 | Lauffer et al. ......... 361/321 |
| 5,068,708 A | 11/1991 | Newman ........... 257/668 |
| 5,475,262 A | 12/1995 | Wang et al. ......... 257/698 |

(Continued)

FOREIGN PATENT DOCUMENTS

| EP | 0 801 468 A2 | 10/1997 |
| WO | 00/45420 | 8/2000 |

OTHER PUBLICATIONS

Al-sarawi, Said F., "Wire Bonded Stacked Chips," Centre for High Performance Integrated Technologies and Systems (CHIPTEC), Mar. 1997, obtained from website "http://www.eleceng.adelaide.edu.au/Personal/alsarawi/Packaging/node35," Jan. 25, 2002, pp. 1-2.

Al-sawari, Said F., "Blind Castellation Interconnection," Centre for High Performance Integrated Technologies and Systems (CHIPTEC), Mar. 1997, obtained from website "http://www.eleceng.adelaide.edu.au/Personal/alsarawi/Packaging/node44," Jan. 25, 2002, p. 1.

Al-sarawi, Said F., "Silicon Efficiency," Centre for High Performance Integrated Technologies and Systems (CHIPTEC), Mar. 1997, obtained from website "http://www.eleceng.adelaide.edu.au/Personal/alsarawi/Packaging/node20," Jan. 25, 2002, pp. 1-2.

(Continued)

*Primary Examiner*—Lynne A. Gurley
*Assistant Examiner*—Junghwa Im
(74) *Attorney, Agent, or Firm*—Dorsey & Whitney LLP

(57) ABSTRACT

A semiconductor package assembly and method for electrically isolating modules, having a capacitor within the semiconductor package assembly. The package assembly and method are suitable for electrically isolating modules according to IEEE 1394.

25 Claims, 3 Drawing Sheets

U.S. PATENT DOCUMENTS

| | | | | |
|---|---|---|---|---|
| 5,864,177 | A | 1/1999 | Sundstrom | 257/723 |
| 5,975,958 | A | 11/1999 | Weidler | 439/620 |
| 6,021,499 | A | 2/2000 | Aleshi | 713/300 |
| 6,023,202 | A | 2/2000 | Hill | 333/24 |
| 6,109,971 | A | 8/2000 | Vadlakonda | 439/620 |
| 6,124,756 | A | 9/2000 | Yaklin et al. | 327/564 |
| 6,147,542 | A | 11/2000 | Yaklin | 327/344 |
| 6,249,171 | B1 | 6/2001 | Yaklin et al. | 327/382 |
| 6,370,012 | B1 | 4/2002 | Adae-Amoakoh et al. | 361/306.3 |
| 6,677,672 | B2 | 1/2004 | Knapp et al. | 257/687 |
| 6,798,666 | B1 | 9/2004 | Alexander et al. | 361/766 |
| 6,833,290 | B2 | 12/2004 | Knapp et al. | 438/123 |
| 6,922,341 | B2 | 7/2005 | Quinlan et al. | 361/734 |
| 2003/0122240 | A1 | 7/2003 | Lin et al. | 257/686 |

OTHER PUBLICATIONS

Al-sarawi, Said F., "Delay," Centre for High Performance Integrated Technologies and Systems (CHIPTEC), Mar. 1997, obtained from website http://www.eleceng.adelaide.edu.au/Personal/alsarawi/Packaging/node22, Jan. 25, 2002, p. 1.

Al-sarawi, Said F., "Noise," Centre for High Performance Integrated Technologies and Systems (CHIPTEC), Mar. 1997, obtained from website http://www.eleceng.adelaide.edu.au/Personal/alsarawi/Packaging/node23, Jan. 25, 2002, p. 1.

Al-sarawi, Said F., "Power Consumption," Centre for High Performance Integrated Technologies and Sytems (CHIPTEC), Mar. 1997, obtained from website http://www.eleceng.adelaide.edu.au/Personal/alsarawi/Packaging/node24, Jan. 25, 2002, p. 1.

Al-sarawi, Said F., "Speed," Centre for High Performance Integrated Technologies and Systems (CHIPTEC), Mar. 1997, obtained from website "http://www.eleceng.adelaide.edu.au/Personal/alsarawi/Packaging/node25," Jan. 25, 2002, p. 1.

Al-sawari, Said F., "Interconnect Capacity," Centre for High Performance Integrated Technologies and Systems (CHIPTEC), Mar. 1997, obtained from website "http://www.eleceng.adelaide.edu.au/Personal/alsarawi/Packaging/node26," Jan. 25, 2002, pp. 1-2.

Al-sarawi, Said F., "Interconnection Capacity Between Packaging Levels," Centre for High Performance Integrated Technologies and Systems (CHIPTEC), Mar. 1997, obtained from website "http://www.eleceng.adelaide.edu.au/Personal/alsarawi/Packaging/node27," Jan. 25, 2002, p. 1.

Al-sarawi, Said F., "Stacked Tape Carrier," Centre for High Performance Integrated Technologies and Systems (CHIPTEC), Mar. 1997, obtained from website http://www.eleceng.adelaide.edu.au/Personal/alsarawi/Packaging/node30, Jan. 25, 2002, p. 1.

Al-sarawi, Said F., "Solder Edge Conductors," Centre for High Performance Integrated Technologies and Systems (CHIPTEC), Mar. 1997, obtained from website http://www.eleceng.adelaide.edu.au/Personal/alsarawi/Packaging/node31, Jan. 25, 2002, pp. 1-2.

Al-sarawi, Said F., "Thin Film Conductors on Face-of-a-Cube," Centre for High Performance Integrated Technologies and Systems (CHIPTEC), Mar. 1997, obtained from website http://www.eleceng.adelaide.edu.au/Personal/alsarawi/Packaging/node32, Jan. 25, 2002, pp. 1-2.

Al-sarawi, Said F., "An Interconnection Substrate Soldered to the Cube Face," Centre for High Performance Integrated Technologies and Systems (CHIPTEC), Mar. 1997, obtained from website http://www.eleceng.adelaide.edu.au/Personal/alsarawi/Packaging/node33, Jan. 25, 2002, pp. 1-2.

Al-sarawi, Said F., "Folded Flex Circuits," Centre for High Performance Integrated Technologies and Systems (CHIPTEC), Mar. 1997, obtained from website http://www.eleceng.adelaide.edu.au/Personal/alsarawi/Packaging/node34, Jan. 25, 2002, p. 1.

Al-sarawi, Said F., "Area Interconnection Between Stacked ICs," Centre for High Performance Integrated Technologies and Systems (CHIPTEC), Mar. 1997, obtained from website http://www.eleceng.adelaide.edu.au/Personal/alsarawi/Packaging/node36, Jan. 25, 2002, p. 1.

Al-sarawi, Said F., "Flip-chip Bonded Stacked Chips Without Spacers," Centre for High Performance Integrated Technologies and Systems (CHIPTEC), Mar. 1997, obtained from website http://www.eleceng.adelaide.edu.au/Personal/alsarawi/Packaging/node37, Jan. 25, 2002, p. 1.

Al-sarawi, Said F., "Flip-chip Bonded Stacked Chips With Spacers," Centre for High Performance Integrated Technologies and Systems (CHIPTEC), Mar. 1997, obtained from website http://www.eleceng.adelaide.edu.au/Personal/alsarawi/Packaging/node38, Jan. 25, 2002, p. 1.

Al-sarawi, Said F., "Microbridge Springs and Thermomigration Vias," Centre for High Performance Integrated Technologies and Systems (CHIPTEC), Mar. 1997, obtained from website "http://www.eleceng.adelaide.edu.au/Personal/alsarawi/Packaging/node39," Jan. 25, 2002, p. 1.

Agere Systems—About 1394, "1394—The High-Speed Serial Interface for All the Right Reasons/1394 Driver Support," obtained from website http://www.agree.com/1394/about.html Jan. 25, 2002, p. 1.

Press Release Tuesday Oct. 17, 2000, "Lucent Technologies introduces low-power IEEE-1394A chip for high-speed connection between PCs and consumer electronic devices," obtained from website http://www.lucent.com/press/1000/001017.mea.html, Jan. 25, 2002, pp. 1-3.

1394 Trade Association: Technology, "1394 Technology," obtained from website http://www.1394ta.org/Technology/, Jan. 25, 2002, p. 1.

1394 Trade Association: Technology, "An Introduction to the Instrument and Industrial Control Protocol," obtained at website http://www.1394ta.org/Download/Technology/iicpPaper2.pdf, Jan. 25, 2002, 6 pages.

Apple Computer, Inc., "Firewire Technology Fact Sheet," obtained at website "http://a772.g.akamai.net/7/772/51/f7f756ae8e5bf0/www.apple.com/firewire/pdf/FireWireFS-b.pdf", Mar. 13, 2002, pp. 1-4.

McMunn, Lee James, "The Physical Layer," obtained at website "http://www.awstevenson.demon.com.uk/SYSNOTES/physic.htm," Mar. 12, 2002, pp. 1-2.

Willis, P. J., "Communication Protocols," obtained at website "http://www.maths.bath.ac.uk/~pjw/NOTES/networks/chapter2_6.html," Aug. 17, 2001, p. 1.

Willis, P. J., "The OSI Model," obtained at website "http://www.maths.bath.ac.uk/~pjw/NOTES/networks/sections2_6_1.html," Aug. 17, 2001, p. 1.

Willis, P. J., "Physical Layer," obtained at website "http://www.maths.bath.ac.uk/~pjw/NOTES/networks/subsection2_6_1_1.html," Aug. 17, 2001, p. 1.

Willis, P.J., "Data Link Layer," obtained at website "http://www.maths.bath.ac.uk/~pjw/NOTES/networks/subsection2_6_1_2.html," Aug. 17, 2001, p. 1.

Willis, P. J., "Network Layer," obtained at website "http://www.maths.bath.ac.uk/~pjw/NOTES/networks/subsection2_6_1_3.html," Aug. 17, 2001, p. 1.

Willis, P. J., "The Physical Layer," obtained at website "http://www.maths.bath.ac.uk/~pjw/NOTES/networks/section2_7_1.html," Aug. 17, 2001, pp. 1-2.

Willis, P. J., "The Datalink Layer," obtained at website "http://www.maths.bath.ac.uk/~pjw/NOTES/networks/section2_7_2.html," Aug. 17, 2001, pp. 1-2.

Embedded Systems Programming, "Fundamentals of Firewire," obtained at website "http://www.embedded.com/1999/9906/9906feat2.htm," Aug. 28, 2001, pp. 1-14.

Microprocessor and Microcomputer Standards Committee of the IEEE Computer Society, "P1394a Draft Standard for a High Performance Serial Bus (Supplement)," The Institute of Electrical and Electronics Engineers, Inc., Jun. 30, 1999, pp. 1-27.

Lucent Technologies, Inc., "IEEE 1394 Isolation," Application Note, Nov. 1998, obtained at website "http://www.agere.com/1394/docs/AP98074-01.pdf," pp. 1-16.

IBM Technical Disclosure Bulletin, "Decoupling Capacitor Structure to Reduce FET Output Driver Switching Noise", Dec. 1, 1987, p. 167-168.

IBM Technical Bulletin, "Clipped Decoupled Twin-Carrier Module for IC Memory Chips", Jan. 1, 1985, p. 4857-4858.

SEMICONDUCTOR PACKAGE ASSEMBLY AND METHOD FOR ELECTRICALLY ISOLATING MODULES

CROSS-REFERENCE TO RELATED APPLICATION

This application is a divisional of U.S. patent application Ser. No. 10/675,965, filed Sep. 30, 2003, issued as U.S. Pat. No. 7,221,040; which is a divisional of U.S. patent application Ser. No. 10/057,205, filed Jan. 25. 2002, issued as U.S. Pat. No. 6,851,183; which claims the benefit of UK Patent Application No. 0126821.8, filed Nov. 7, 2001.

TECHNICAL FIELD

The present invention relates to semiconductor device packaging, and more particularly, to electrically isolating semiconductors within a package assembly.

BACKGROUND OF THE INVENTION

Computers are routinely used to receive and process data from peripheral devices such as digital cameras and digital video recorders. The peripheral devices typically transfer data to a computer via a serial bus. Viewing images captured by these peripheral devices in real-time, for example, requires the peripheral device to transfer a relatively large amount of data to the computer in a relatively short amount of time. In the past, computers used a Universal Serial Bus ("USB") to transfer such data, but a USB cannot guarantee real-time viewing of digital transmissions due to its inherent limitations. Thus, the IEEE 1394 standard was developed to allow simple, low-cost, high-bandwidth, real-time data interfacing between computers and peripherals without significant signal degradation.

IEEE 1394 is a nonproprietary, high-speed, serial bus input/output standard. It provides a comprehensive standard for connecting digital devices, including personal computers and consumer electronics hardware. It is also platform-independent, scalable (expandable), and flexible in supporting peer-to-peer (roughly, device-to-device) connections. IEEE 1394 preserves data integrity by eliminating the need to convert digital signals into analog signals. Created for desktop networks by Apple Computer, which called the technology FIREWIRE™, and further developed by the IEEE 1394 working group, it is considered a low-cost interface for devices such as digital cameras, camcorders, and multimedia devices. In addition, it is seen as a means of integrating personal computers and home electronics equipment.

FIG. 1 illustrates peer-to-peer connections according to the IEEE 1394 standard. A computer 102 in a room 104 is communicatively coupled to a computer 106 in a room 108 via a serial bus 105. Another serial bus 109 is used to communicatively couple the computer 106 to another computer 110 in another room 112. Each computer on the network includes networking components that implement IEEE 1394.

FIG. 2 illustrates the IEEE 1394 networking components 200 that include a physical layer chip ("PHY") 202 and a link layer chip ("LINK") 204. The LINK chip 204 contains the networking intelligence to process and generate networking signals, such as arbitration signals and packets. The PHY chip 202 is the physical interface by which the computer system may receive or send networking information to and from the serial bus. The PHY chip 202 also serializes the data from the LINK chip 204 if the data is to be sent out to the serial bus 220, and likewise deserializes the data from the cable to be sent to the LINK chip 204 in parallel format. There are typically at least fourteen wires that communicatively couple the PHY chip 202 to the LINK chip 204.

IEEE 1394 specifies that all devices connected to a serial bus have the same reference ground potential as provided by the ground wire of the serial bus. IEEE 1394 recognizes, however, that separate devices connected to the bus may have different ground potentials. Such voltage differences could result in direct current flowing from the device having the higher ground potential to the device having the lower ground potential. Not only could such a current flow cause signal degradation, but it could cause damage to circuitry within the device as well. Thus, IEEE 1394 recommends that the ground wire of the serial bus be electrically isolated from the rest of the networking components in order that all PHY chips connected to a serial bus operate on the same isolated ground domain.

FIG. 2 illustrates the recommended arrangement for electrical isolation of the PHY 202 and LINK 204 networking components. The ground 216 of the LINK chip 204 is coupled to the computer's chassis (not shown) as a reference. The ground 212 of the PHY chip is coupled to the ground 213 of the serial bus 220. A parallel configuration of a capacitor 208 and a resistor 206 effectively isolate the ground 213 of the serial bus 220 from the ground 216 of the LINK chip 204. The PHY and LINK chips are communicatively coupled by capacitors 214.

This approach works well, but it is incompatible with the trend to reduce the size of electronic devices. Two major reasons account for the desire to decrease the size, shape, and configuration of electronic devices. First, smaller footprint circuitry allows a reduction in the trace lines that go from any pin on an integrated circuit package to the pad on a die, helping to increase signal integrity. Second, smaller components occupy less space on a printed circuit board, thus allowing more room for other useful components on the same printed circuit board. Hence, the solution offered by IEEE 1394 using an external capacitor and resistor to electrically isolate the PHY and LINK chips creates unnecessary bulkiness through use of additional electronic components. And while combined PHY-LINK chips are commercially available, such chips operate on the same ground potential and thus are unsuitable for distributed systems where differences in ground potential may exist. Thus, there is a need for structures for connecting digital devices while isolating them from undesired direct current while also conforming with the trend toward miniaturization of electronic devices.

SUMMARY OF THE INVENTION

The present invention is directed to electronic module packages having a capacitor incorporated within the package for electrically isolating the modules. The resulting package requires less external electronic components than the assemblies currently employed to electrically isolate modules. The present invention is further directed to methods for electrically isolating modules within a package assembly.

DETAILED DESCRIPTION OF THE INVENTION

Figure 1:
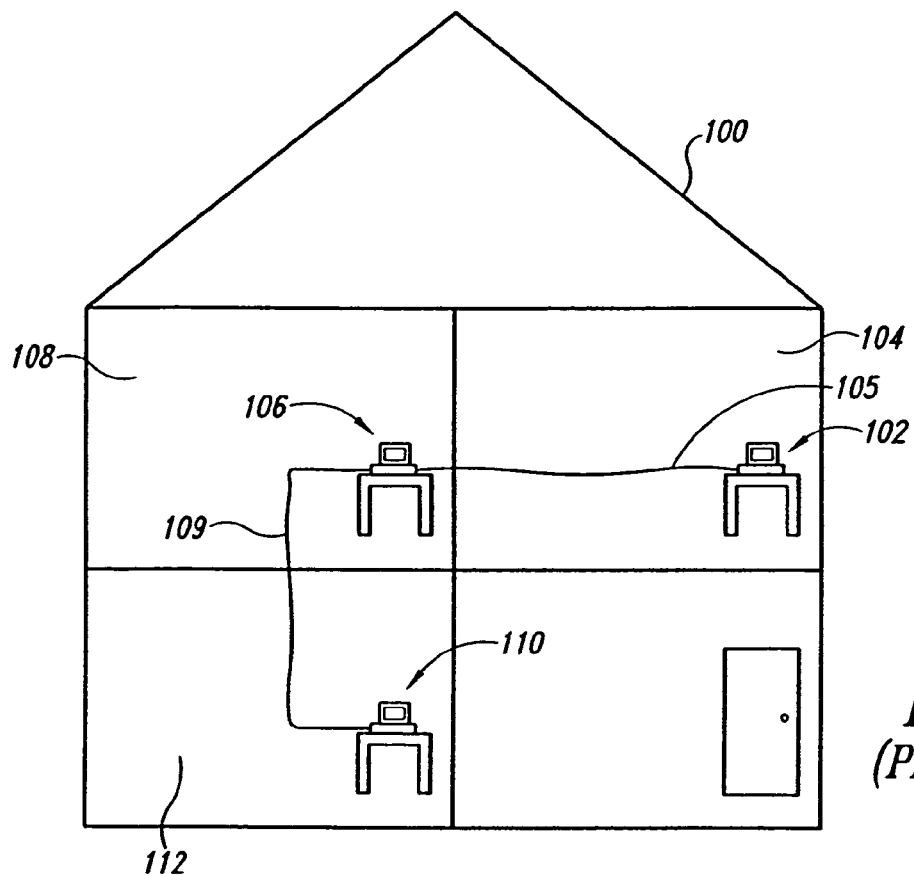
FIG. 1 is a pictorial diagram showing a conventional network in a building.
Figure 2:
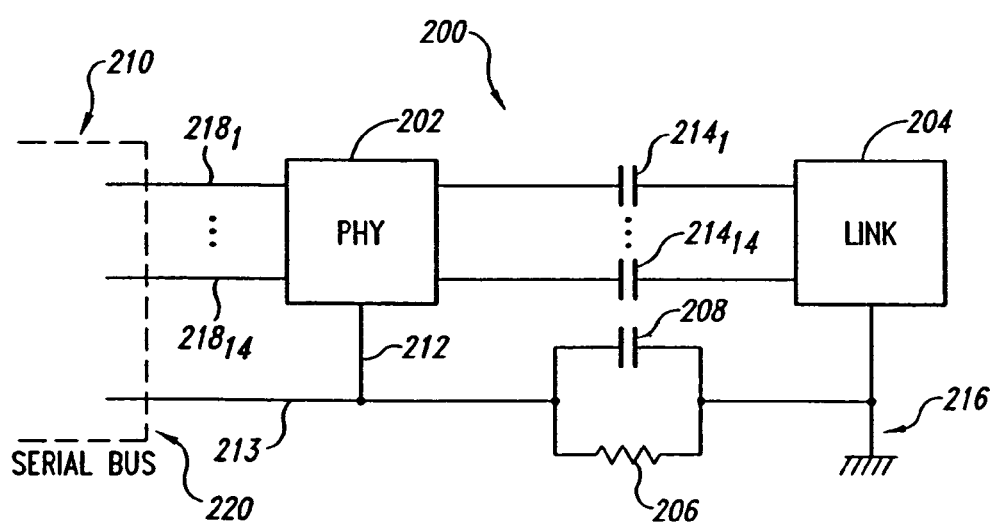
FIG. 2 is a block diagram of conventional networking components according to IEEE 1394.

As previously mentioned, there is a general trend within the electronics industry towards miniaturization of components such as semiconductor packages. Miniaturization is aided by consolidating various components into a single package. Not only will such a single-package arrangement typically be smaller, but it will ordinarily result in lower manufacturing costs. Embodiments of the present invention include semiconductor package assemblies incorporating a capacitor within the assembly to electrically isolate modules.

Methods and materials for manufacturing semiconductor package assemblies are well-known in the art. Semiconductor devices are typically fabricated on thin wafers of silicon. Several dice are produced on each wafer, with each die representing a single semiconductor device. Each die on a wafer is tested for gross functionality, and sorted according to whether the die passes or fails the gross functionality test. After being sorted according to gross functionality, the wafers are cut using a wafer saw, and the individual die are singulated. The die determined to be non-functional are scrapped. The functional die are packaged and further tested to ensure that each packaged device satisfies a minimum level of performance. Typically, the functional devices are permanently packaged by encapsulating the die in a non-conductive dielectric material. Packaging of the functional devices facilitates handling of the devices and also protects the die from damage during the manufacture of circuits using the packaged devices.

Recently, semiconductor manufacturers have developed a package structure where unpackaged die are mounted directly onto a substrate, for example, a printed circuit board, thus allowing modules to be designed with increased device density. Examples of these types of packages structures include ball grid array (BGA) packages, and other chip scale packages (CSP) having package dimensions that are slightly larger than the dimension of the encapsulated die. The die is mounted onto the substrate and is electrically coupled to conductive traces formed on the substrate by wire bonding the bond pads of the die. Alternatively, the conductive traces and the bond pads may be electrically coupled by using tape automated bonded (TAB) wire instead. The resulting structure is subsequently, partially or entirely, encapsulated to protect the device from damage. External leads, often in the form of solder balls, are then attached to attachment sites on the conductive traces so that the integrated circuit fabricated on the die may be electrically contacted through the external leads.

Following packaging, the device is typically mounted onto a printed circuit board (PCB) as a component in a larger electronic system. Conductive pads on the PCB are positioned to correspond to the location of the external leads of the packaged device. The packaged device is positioned accordingly onto the conductive pads and subjected to a reflow process at an elevated temperature in order to solder the packaged device to the PCB. In the case of a BGA type package, the solder is provided by the solder balls of the completed package.

Figure 3:
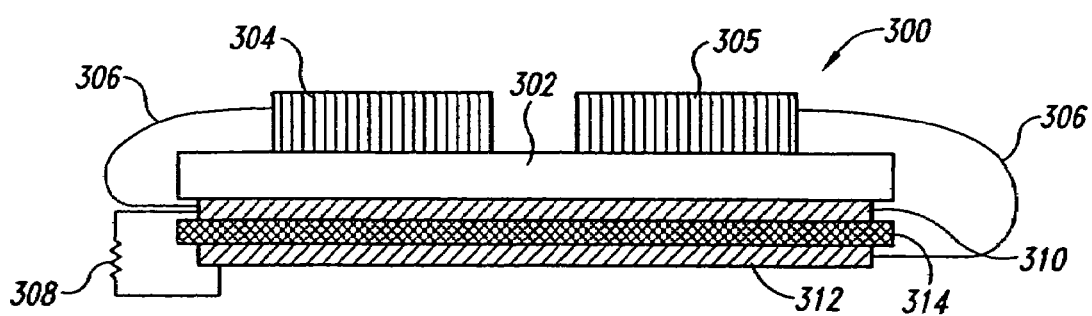
FIG. 3 is a cross-sectional view of a package assembly according to one embodiment of the present invention.

FIG. 3 illustrates an example of a package assembly 300 according to one embodiment of the present invention. A first electronic module 304 and a second electronic module 305 are attached to a substrate 302. The first and second modules are communicatively coupled by metallic traces (not shown) on the substrate that have capacitors in series to prevent direct current from flowing between the modules. A capacitor is formed within the package by conductively coupling the ground plane of the first electronic module 304 to a first conductive surface 310 below the substrate 302, and the ground plane of the second electronic module 305 conductively coupled to the second conductive surface 312 that is spaced apart from the first conductive surface 310. The first and second conductive surfaces 310, 312 are further separated by a dielectric 314. A resistor 308 is coupled between the first and second conductive surfaces 310, 312 by its first and second terminals respectively to allow the conductive surfaces to equilibrate after power is shut off to the modules.

One of ordinary skill in the art would readily appreciate that various suitable materials may be selected for the package assembly. For example, the resistor can be of any size sufficient to store a charge on the conductive surfaces while in operation and allow the conductive surfaces to equilibrate after power is shut off. Typically, however, resistance of approximately one megohm is desirable. Similarly, the dielectric may be any suitable non-conductive material. In addition, the modules 304, 305 may be conductively coupled to the conductive surfaces 310, 312 in a number of ways, such as with wires 306 bonded between the modules 304, 305, and the conductive surfaces 310, 312, or via metallic traces on the substrate. The particular qualities of the electronic components and the means by which they are coupled to other devices as described above are provided as a non-limiting example of a typical embodiment in accordance with the present invention, and are not intended to limit the scope of the present invention.

According to IEEE 1394, the first module 304 is a PHY chip conductively coupled to a serial bus (not shown) in order to send signals to or receive signals from another device on the bus. The PHY chip 304 is further conductively coupled to the ground wire of the serial bus (not shown). The second electronic module 305 is a LINK chip that is communicatively coupled to the PHY chip 304 via a number of capacitors in series (not shown); the communicative coupling transmits signals originating from the serial bus and processed by the PHY chip 304. The LINK chip 305 is further conductively coupled to the chassis of the computer (not shown) in which it is housed. The PHY 304 and LINK 305 chips are each conductively coupled to a first conductive surface 310 and second conductive surface 312, respectively. A capacitor is formed within the package assembly by the first conductive surface 310 being conductively coupled to the serial bus ground wire (not shown) and spaced apart by a dielectric from the second conductive surface 312, which is conductively coupled to the chassis ground 216 of the computer (not shown) and the LINK chip 305. A resistor 308 provides a path to the local chassis ground in the event a charge is coupled to the serial bus ground. In addition, when power is shut off to the PHY and LINK chips 304, 305, the resistor 308 allows the direct current to flow between the surfaces 310, 312 to normalize any potential differences between the two surfaces while preventing too much direct current from damaging the first 304 and second 305 modules that are conductively coupled to the conductive surfaces. Although the resistor 308 is depicted as external, one skilled in the art would readily appreciate that the resistors in the embodiments discussed herein may be integral to the semiconductor device packages and formed of any suitable material, such as thin resistive film. The particular qualities of the modules and how they are coupled to other devices as described above are provided as a non-limiting example of an embodiment in accordance with the present invention, and are not intended to limit the scope of the present invention.

Figure 4:
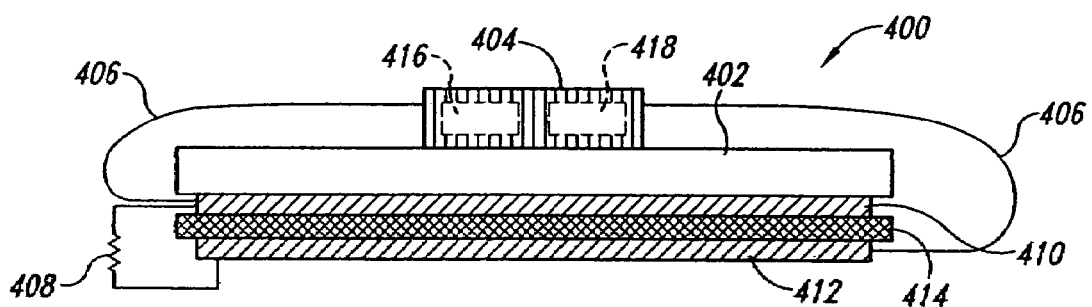
FIG. 4 is a cross-sectional view of a package assembly according to another embodiment of the present invention.

FIG. 4 illustrates a cross sectional view of another embodiment of the present invention where first and second integrated circuits 416, 418 are incorporated within a single module 404 while remaining electrically isolated. Methods and materials for manufacturing a single module having two or more semiconductors are well-known in the art, and will not be described in detail herein. A capacitor is formed by the ground pin (not shown) of the first integrated circuit 416 conductively coupled to the first conductive surface 410 spaced apart from the second integrated circuit 418 conductively coupled by its ground pin (not shown) to the second conductive surface 412 using wires 406 or any other suitable conductive coupling.

Figure 5:
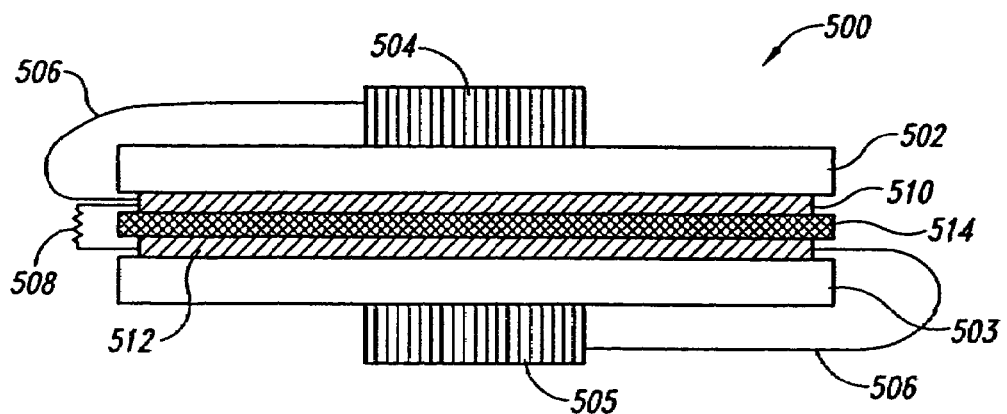
FIG. 5 is a cross-sectional view of a package assembly according to another embodiment of the present invention.

FIG. 5 illustrates another embodiment of the present invention where the package assembly has electronic modules 504, 505 on separate substrates 502, 503 within the assembly. In this embodiment, a first electronic module 504 is attached to a first substrate 502 and a second electronic module 505 attached to a second substrate 503 are spaced apart by the first and second conductive surfaces 510, 512 and the dielectric 514. As with other embodiments of the invention, the first and second electronic modules 504, 505 are conductively coupled to the first and second conductive surfaces 510, 512 respectively with wire bonds 506 or any other suitable conductive couplings. A dielectric 514 is interposed between the conductive surfaces 510, 512 to prevent direct current from flowing between the conductive surfaces.

Figure 6:
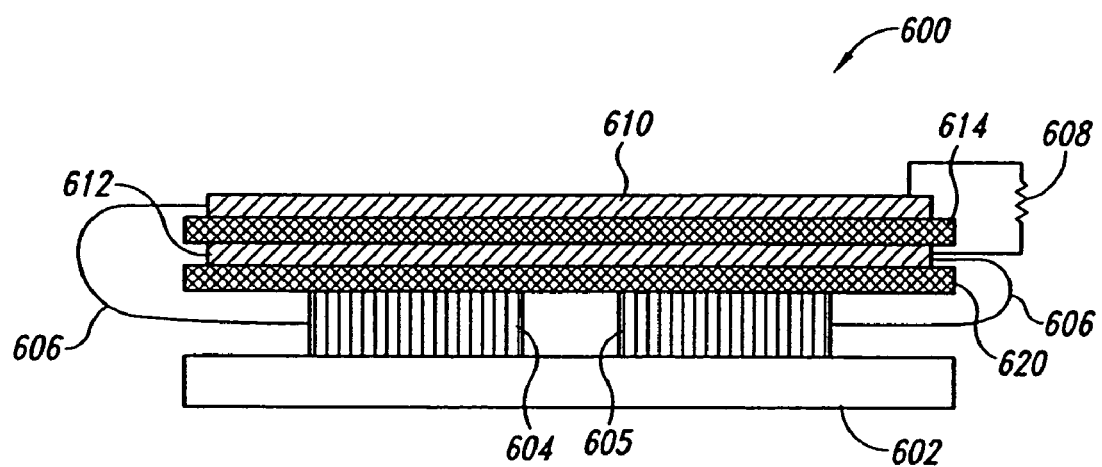
FIG. 6 is a cross-sectional view of a package assembly according to yet another embodiment of the present invention.

FIG. 6 illustrates yet another embodiment of the present invention, where the capacitor formed by the first and second conductive surfaces 610, 612 and dielectric 614 is on the same side of the substrate 602 as the first and second electronic modules 604, 605. The electronic modules 604 605 may also be combined into a single structure as shown in FIG. 4.

Figure 7:
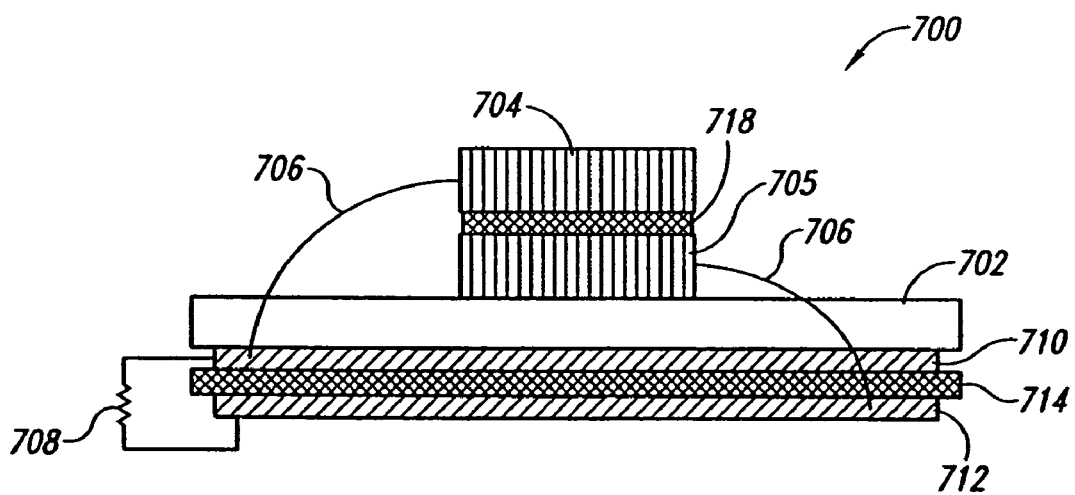
FIG. 7 is a cross-sectional view of a package assembly according to another embodiment of the present invention.

FIG. 7 illustrates another embodiment of the invention where the first and second electronic modules 704, 705 are stacked on the substrate 702, as opposed to both being attached to the substrate as illustrated in, for example, FIGS. 3 and 6. The electronic modules 704, 705 are attached with adhesive at the bondline 718. Methods and materials for attaching electronic modules with adhesives are well-known in the art, and the details will not be described in detail herein.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An integrated circuit package assembly for electrically isolating integrated circuits within a module, comprising:
   a substrate;
   a first module having a first and opposing second side attached to the substrate on the first side;
   a second module having a first and opposing second side attached to the substrate on the first side;
   a non-conductive layer having a first and opposing second side, the first side proximate to the opposing second sides of the first and second modules;
   a first conductive surface proximate to the second side of the first non-conductive layer, the first conductive surface conductively coupled to the first module; and
   a second conductive surface spaced apart from the first conductive surface to form a capacitor with the first conductive surface, the second conductive surface being conductively coupled to the second module.

2. The package assembly of claim 1, further comprising a dielectric interposed between the first and second conductive surfaces.

3. The package assembly of claim 1, further comprising an encapsulation substantially surrounding the package assembly.

4. The package assembly of claim 1 wherein the package assembly is encased in one of a polymer, ceramic, and glass.

5. The package assembly of claim 1 wherein the first module is an integrated circuit.

6. The package assembly of claim 4 wherein the integrated circuit is a physical layer chip.

7. The package assembly of claim 5 wherein the second module is an integrated circuit.

8. The package assembly of claim 5 wherein the integrated circuit is a link layer chip.

9. The package assembly of claim 1, further comprising a resistor having a first terminal coupled to the first conductive surface and further having a second terminal coupled to the second conductive surface.

10. The package assembly of claim 9 wherein the resistor has a resistance of approximately one megohm.

11. The package assembly of claim 9 wherein the resistor is a resistant film.

12. The package assembly of claim 1, further comprising a first ground plane connected to the first conductive surface, and a second ground plane connected to the second conductive surface.

13. The package assembly of claim 12 wherein the first ground plane comprises a ground wire of a cable bus.

14. The package assembly of claim 12 wherein the second ground plane comprises a chassis of a computer.

15. A package assembly, comprising:
   a substrate having a first side attached to a first side of a first module and a first side of a second module;
   a first dielectric layer having a first side attached to a second side of the first module and a second side of the second module;
   a first conductive layer having a first side attached to a second side of the first dielectric layer, the first conductive layer being coupled to the first module;
   a second dielectric layer having a first side attached to a second side of the first conductive layer;
   a second conductive layer having a first side attached to a second side of the second dielectric layer; and
   a resistor having a first terminal coupled to the first conductive layer and a second terminal coupled to the second conductive surface.

16. The integrated circuit package assembly of claim 15 wherein the package assembly is encased in one of a polymer, ceramic and glass.

17. The package assembly of claim 15 wherein the first and second modules are integrated circuits.

18. The integrated circuit package assembly of claim 17 wherein the integrated circuits are one of link layer chip and physical layer chip.

19. A method of isolating modules in a package assembly, comprising:

securing a first side of a first and second module to a substrate;

securing a first side of a dielectric layer to a second side of the first and second module;

forming a capacitor on a second side of the dielectric layer, the capacitor having a first terminal and a second terminal;

coupling the first module to the first terminal of the capacitor; and coupling a second module to the second terminal of the capacitor.

20. The method of claim 19 further comprising coupling a resistor between the first terminal of the capacitor and second terminal of the capacitor.

21. The method of claim 19 wherein the resistor has a resistance of approximately one megohm.

22. The method of claim 19 wherein the first and second modules comprise a first and second integrated circuit.

23. A method of isolating modules within a package assembly, comprising:

mounting a first side of a first module to a substrate;

mounting a first side of a second module to a substrate;

securing a first side of a first dielectric layer to at least one of a second side of the first and second module;

securing a first side of a first conductive layer to a second side of the first dielectric layer;

securing a first side of a second dielectric layer to a second side of the first conductive layer;

securing a first side of a second conductive layer to a second side of the second dielectric layer;

coupling the first module to the first conductive layer; and coupling the second module to the second conductive layer.

24. The method of claim 23 further comprising encasing the package assembly in one of a polymer, ceramic, and glass.

25. The method of claim 23 wherein the first and second modules are coupled to the first and second conductive layer, respectively, by wire bonding.

* * * * *